(12) United States Patent
Shih et al.

(10) Patent No.: US 7,969,717 B1
(45) Date of Patent: Jun. 28, 2011

(54) COMPUTER SERVER

(75) Inventors: Fu-Chiao Shih, Taipei Hsien (TW);
Te-Chung Kuan, Taipei Hsien (TW);
Chan-Kuei Hsu, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 0 days.

(21) Appl. No.: 12/825,560

(22) Filed: Jun. 29, 2010

(30) Foreign Application Priority Data

Jun. 8, 2010 (TW) .............................. 99118509 A

(51) Int. Cl.
*H05K 5/00* (2006.01)
*H05K 7/00* (2006.01)

(52) U.S. Cl. ................ 361/679.02; 361/679.6; 361/727; 361/752

(58) Field of Classification Search ............. 361/679.02, 361/679.6, 727, 752
See application file for complete search history.

(56) References Cited

U.S. PATENT DOCUMENTS 6,970,346 B2 * 11/2005 Shih .......................... 361/679.02
2009/0152216 A1 * 6/2009 Champion et al. .............. 211/26
* cited by examiner

*Primary Examiner* — Jayprakash N Gandhi
*Assistant Examiner* — Anthony M Haughton
(74) *Attorney, Agent, or Firm* — Clifford O. Chi

(57) ABSTRACT

A server includes a casing, a motherboard and a power supply module received in the casing. The casing includes a bottom plate and a first sidewall substantially perpendicular to the bottom plate. The first sidewall defines a through hole close to the bottom plate. The motherboard is substantially parallel with the bottom plate and is fixed above the through hole. The motherboard includes a first surface and a second surface. A receiving space is defined between the second surface and a bottom plate. A number of electrical elements are disposed on the first surface. The power supply module can be inserted through the through hole to be received in the receiving space.

2 Claims, 3 Drawing Sheets

COMPUTER SERVER

BACKGROUND

1. Technical Field

The present disclosure relates to a computer server.

2. Description of Related Art

Computer servers generally include a casing, a mother board, and a power supply. The motherboard is disposed on a bottom plate of the casing. A central processing unit (CPU), a number of storing devices, a plurality of other peripheral components are disposed on the motherboard. Typically, the CPU and the storing devices are positioned lower than the other peripheral components. To reduce the height of the computer server, the power supply is disposed above the CPU and the storing devices. As such, it becomes difficult to remove the CPU or the storing devices because the power supply must be removed.

Therefore, it is desirable to provide a server that can overcome the above-mentioned limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
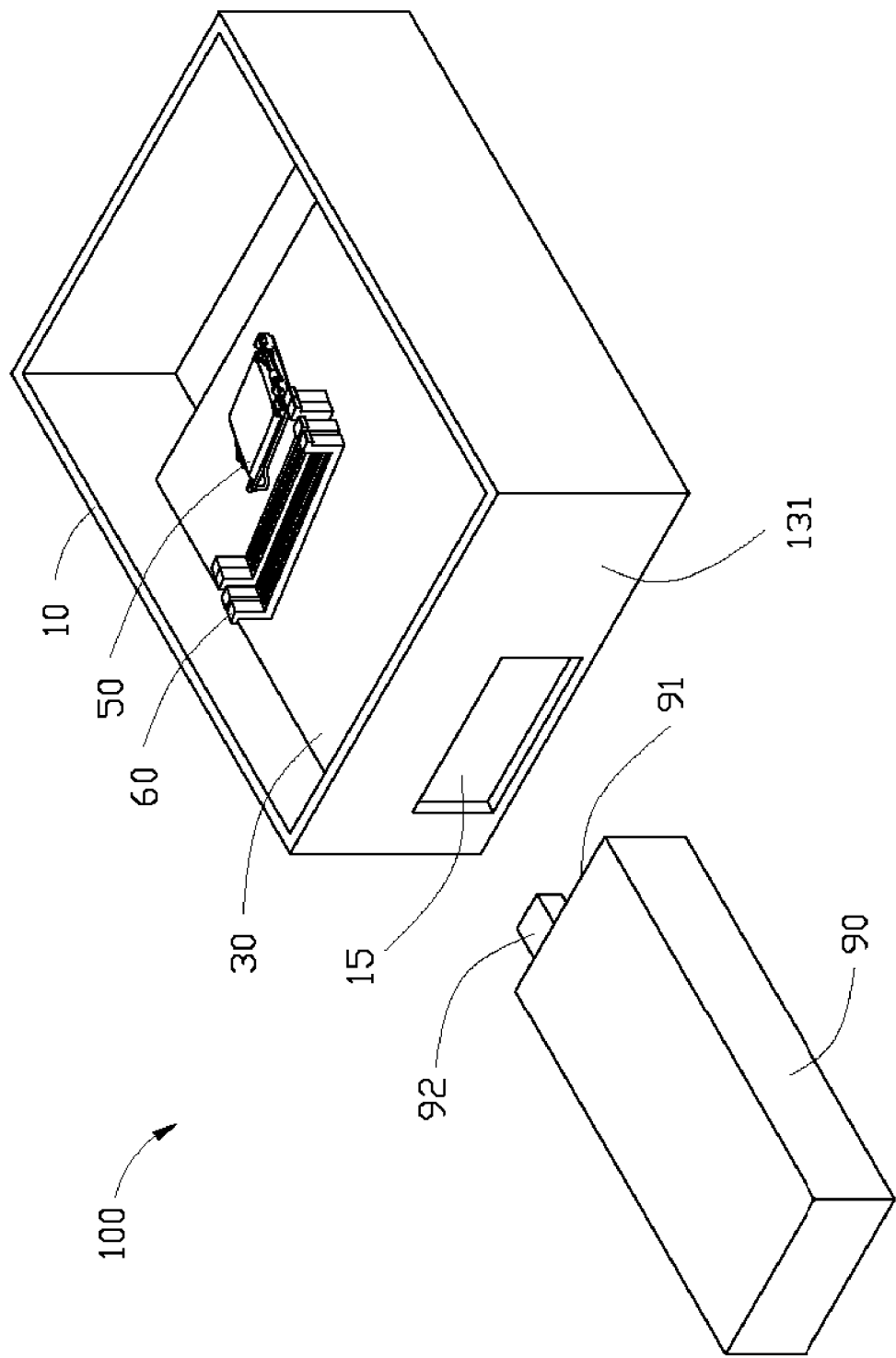
FIG. 1 is a schematic view of a computer server, according to one embodiment.
Figure 2:
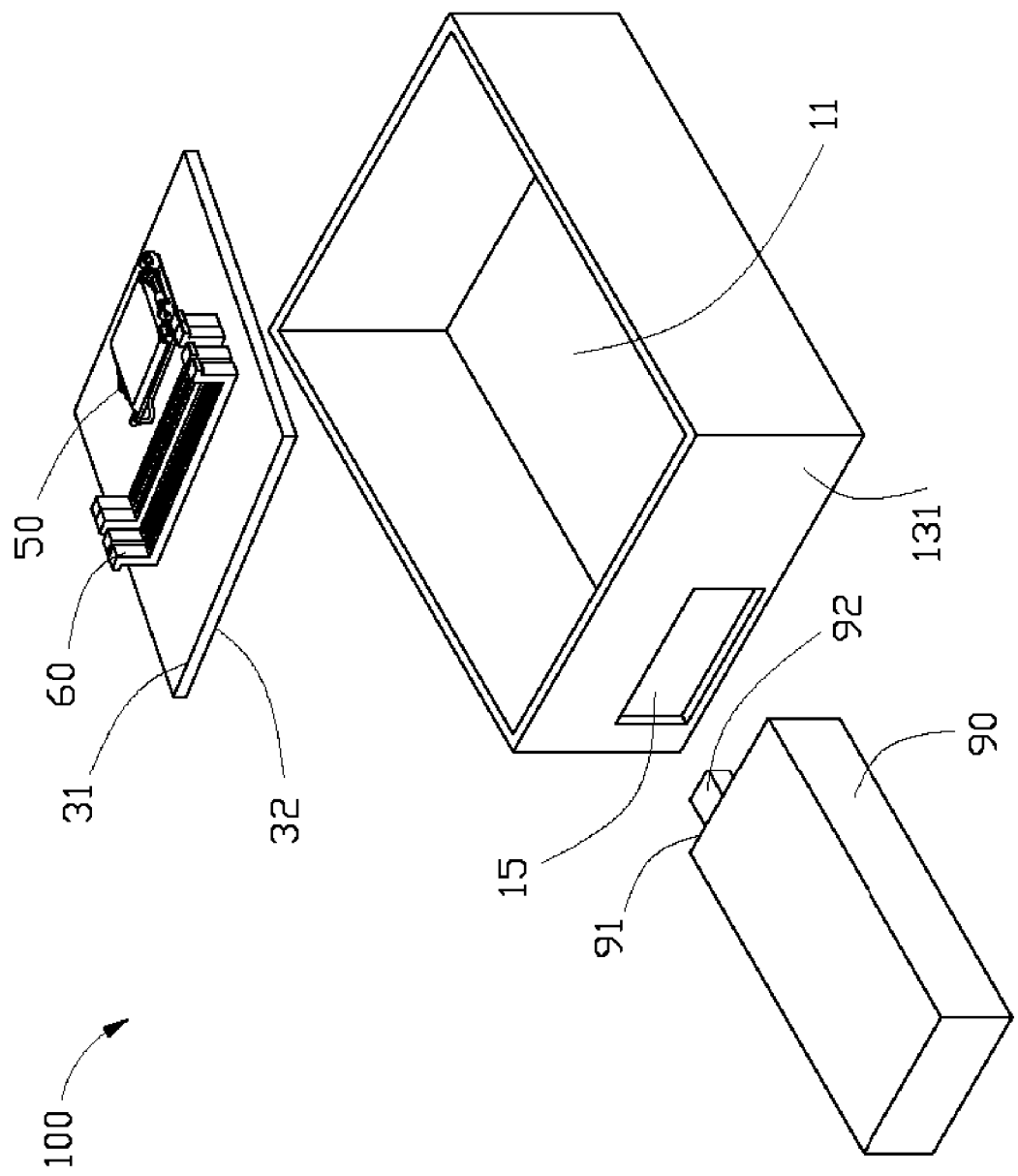
FIG. 2 is an exploded view of the computer server of FIG. 1.

Referring to FIG. 1 and FIG. 2, one embodiment of a computer server 100 includes a casing 10, a motherboard 30, and a power supply 90.

The casing 10 is configured for housing the motherboard 30 and the power supply 90. The casing 10 includes a bottom plate 11 and a first sidewall 131 substantially perpendicular to the bottom plate 11. The first sidewall 131 defines a through hole 15 close to the bottom plate 11.

Figure 3:
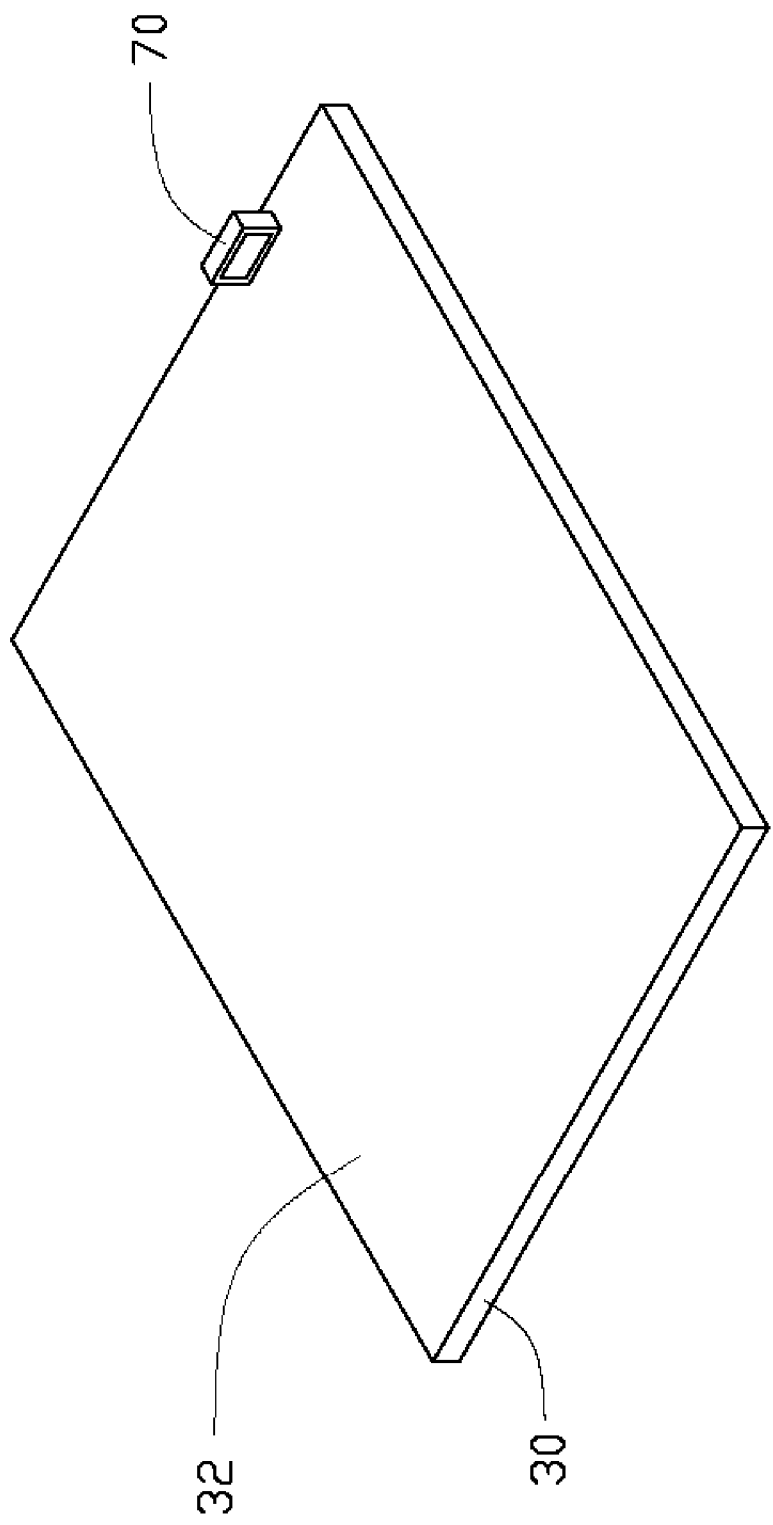
FIG. 3 is a schematic view of a motherboard of the computer server of FIG. 1, viewed from another direction.

The motherboard 30 is fixed to the first sidewall 131, substantially parallel with the bottom plate 11, and positioned above the through hole 15. The motherboard 30 includes a first surface 31 and a second surface 32 opposite to the first surface 31 and facing the bottom plate 11. A receiving space is formed between the second surface 32 and the bottom plate 11. A number of electrical components, e.g. a CPU 50 and two storing devices 60, are disposed on the first surface 31. Referring to FIG. 3, the motherboard 30 includes a main power supply interface 70 fixed on the second surface 32 and facing the through hole 15. The CPU 50 and the storing devices 60 are electrically connected to the main power supply interface 70. It is noteworthy that the motherboard 30 also can be fixed on the other sidewalls of the casing 10.

The power supply module 90 can be inserted through the through hole 15 to be received in the receiving space. The power supply module 90 includes an inserting surface 91 and a power supply plug 92. The power supply plug 92 is fixed on the inserting surface 91 corresponding to the main power supply interface 70 and thus the power supply plug 92 can plug into the main power supply interface 70 to power the electrical components. The shape and the area of the inserting surface 91 is same as the through hole 15 respectively.

It will be understood that the above particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A computer server comprising:
   a casing comprising a bottom plate and a first sidewall substantially perpendicular to the bottom plate, the first sidewall defining a through hole close to the bottom plate;
   a motherboard substantially parallel with the bottom plate and fixed above the through hole, the motherboard comprising a first surface facing away from the bottom plate, a second surface opposite to the first surface, and a main power supply interface fixed on the second surface and facing the through hole, wherein a receiving space is defined between the second surface and the bottom plate;
   a power supply module comprising an inserting surface and a power supply plug fixed on the inserting surface, wherein the power supply plug is insertable into the main power supply interface when the power supply module inserts through the through hole to be received in the receiving space along a direction that is substantially parallel to the second surface; and
   a plurality of electrical elements disposed on the first surface and electrically connected to the main power supply interface.

2. The computer server in claim 1, wherein the shape and the area of the inserting surface is the same as the through hole.

* * * * *